US009450584B2

(12) United States Patent
Kim

(10) Patent No.: US 9,450,584 B2
(45) Date of Patent: Sep. 20, 2016

(54) SEMICONDUCTOR DEVICE

(71) Applicant: Min-Su Kim, Hwaseong-Si (KR)

(72) Inventor: Min-Su Kim, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/870,351

(22) Filed: Sep. 30, 2015

(65) Prior Publication Data

US 2016/0142055 A1     May 19, 2016

(30) Foreign Application Priority Data

Nov. 19, 2014    (KR) ........................ 10-2014-0161946

(51) Int. Cl.
| | | |
|---|---|---|
| *H03K 19/0175* | (2006.01) | |
| *H03K 19/0185* | (2006.01) | |
| *H03K 19/20* | (2006.01) | |
| *H03K 3/356* | (2006.01) | |

(52) U.S. Cl.
CPC ...... *H03K 19/018507* (2013.01); *H03K 3/356* (2013.01); *H03K 3/356173* (2013.01); *H03K 19/20* (2013.01)

(58) Field of Classification Search
CPC ..................... H03K 19/096; H03K 3/356191; H03K 3/356026; H03K 5/135; H03K 19/09443; H03K 3/356017; H03K 19/0013; H03K 19/017509; H03K 19/01806; H03K 19/018507; H03K 19/018514; H03K 19/018521; H03K 19/018528; H03K 3/35613; H03K 3/356156; H03K 3/356173; H03K 3/356; G06F 2207/3872; H01L 27/11803; H04J 3/047
See application file for complete search history.

(56) References Cited

U.S. PATENT DOCUMENTS

| | | | |
|---|---|---|---|
| 6,633,992 B1 * | 10/2003 | Rosen ................ H03K 19/0963 326/93 |
| 6,972,605 B1 | 12/2005 | Choe | |
| 7,576,582 B2 | 8/2009 | Lee et al. | |
| 7,595,665 B2 * | 9/2009 | Park ................... H03K 19/0016 326/95 |
| 7,639,057 B1 * | 12/2009 | Su ............................. G06F 1/10 326/93 |
| 7,902,878 B2 * | 3/2011 | Saint-Laurent .... H03K 19/0016 326/95 |
| 7,962,883 B2 | 6/2011 | Kitahara et al. | |
| 8,030,982 B2 * | 10/2011 | Datta ............... H03H 3/356086 327/211 |
| 8,341,578 B2 | 12/2012 | Campbell et al. | |
| 8,570,069 B2 | 10/2013 | Zid et al. | |
| 9,124,261 B2 * | 9/2015 | Kim ................. H03K 3/356173 |
| 2004/0201401 A1 * | 10/2004 | Morris ................ H04L 25/0278 326/30 |
| 2011/0133806 A1 | 6/2011 | Subramani et al. | |
| 2012/0139601 A1 * | 6/2012 | Kim ....................... H03K 3/356 327/212 |
| 2012/0268182 A1 | 10/2012 | Lee et al. | |

FOREIGN PATENT DOCUMENTS

JP     2010-0124059 A     6/2010

* cited by examiner

*Primary Examiner* — Vibol Tan

(74) *Attorney, Agent, or Firm* — Volentine & Whitt, PLLC

(57) ABSTRACT

A semiconductor device includes a first circuit applying an enable signal having a first logic level and a clock signal having the first logic level, supplying a first voltage to a first node and converting a voltage level of the first node into a second logic level different from the first logic level, and a second circuit applying an enable signal having the second logic level and a clock signal having the first logic level, supplying a second voltage to a second node different from the first node and converting a voltage level of the second node into the second logic level. The second circuit includes an operation circuit performing a NAND operation on the logic level of the enable signal and the voltage level of the second node, and a switch turned on in response to an output of the operation circuit and supplying the second voltage to the second node.

19 Claims, 15 Drawing Sheets

1400

SEMICONDUCTOR DEVICE

CROSS-REFERENCE TO RELATED APPLICATION

This application claims priority under 35 U.S.C. §119 from Korean Patent Application No. 10-2014-0161946 filed on Nov. 19, 2014, the subject matter of which is hereby incorporated by reference.

BACKGROUND

Embodiments of the inventive concept relate generally to semiconductor devices. More particularly, embodiments of the inventive concept relate to logic circuits in semiconductor devices capable of controlling the generation of a clock signal.

Contemporary semiconductor devices integrate a great multiplicity of logic circuits onto a single chip. As the integration density of the elements and components forming logic increases, power consumption, per unit area of chip, gradually increases. Such rising power consumption per unit area brings with it a commensurate problem of heat dissipation for portions or the entirety of the semiconductor chip.

So-called flip-flop elements (hereafter, singularly or collectively referred to as a "flip-flop"), as well as the clock gating circuitry used to supply a clock signal to a flip-flop are well recognized as being among the most relatively power hungry elements of logic circuits. Accordingly, research and development efforts have focused on reducing the power consumption of these elements and related circuits in semiconductor devices while at the same time maintaining acceptable performance profiles.

SUMMARY

Embodiments of the inventive concept provide semiconductor devices and semiconductor circuits having improved product reliability with reduced power consumption.

According to an aspect of the inventive concept, there is provided a semiconductor device includes a first circuit applying an enable signal having a first logic level and a clock signal having the first logic level, supplying a first voltage to a first node and converting a voltage level of the first node into a second logic level different from the first logic level, and a second circuit applying an enable signal having the second logic level and a clock signal having the first logic level, supplying a second voltage to a second node different from the first node and converting a voltage level of the second node into the second logic level, wherein the second circuit includes an operation circuit performing a NAND operation on the logic level of the enable signal and the voltage level of the second node, and a switch turned on in response to an output of the operation circuit and supplying the second voltage to the second node.

According to another aspect of the inventive concept, there is provided a semiconductor device including a first circuit applying an enable signal having a first logic level and a clock signal having the first logic level, supplying a first voltage to a first node and converting a voltage level of the first node into a second logic level different from the first logic level, and a second circuit applying an enable signal having the second logic level and a clock signal having the first logic level, supplying a second voltage to a second node different from the first node and converting a voltage level of the second node into the second logic level, wherein the second circuit includes a switch controlled by the voltage level of the second node when the voltage level of the first node transitions to the second logic level, and supplying the second voltage to the second node.

According to still another aspect of the inventive concept, there is provided a semiconductor device including a first node, a second node, a first transistor gated to a logic level of a clock signal and developing a voltage level of the first node, a second transistor gated to a logic level of an enable signal and developing the voltage level of the first node, a third transistor gated to a voltage level of the second node and developing the voltage level of the first node, a fourth transistor gated to the logic level of the clock signal and developing the voltage level of the second node, a fifth transistor gated to the voltage level of the first node and developing the voltage level of the second node, and a sixth transistor gated to the logic level of the enable signal and the voltage level of the second node and developing the voltage level of the second node.

According to a further aspect of the inventive concept, there is provided a semiconductor device including a first node, a second node, a first transistor gated to a logic level of a clock signal and a voltage level of a second node and developing a voltage level of the first node, a second transistor gated to a logic level of an enable signal and developing the voltage level of the first node, a third transistor gated to the logic level of the clock signal and the voltage level of the second node and developing the voltage level of the first node, a fourth transistor gated to the logic level of the clock signal and developing the voltage level of the second node, a fifth transistor gated to the voltage level of the first node and developing the voltage level of the second node, and a sixth transistor gated to the logic level of the enable signal and the voltage level of the second node and developing the voltage level of the second node.

BRIEF DESCRIPTION OF THE DRAWINGS

The above and other features and advantages of the inventive concept will become more apparent upon consideration of certain embodiments thereof with reference to the attached drawings in which.

DETAILED DESCRIPTION

Figure 1:
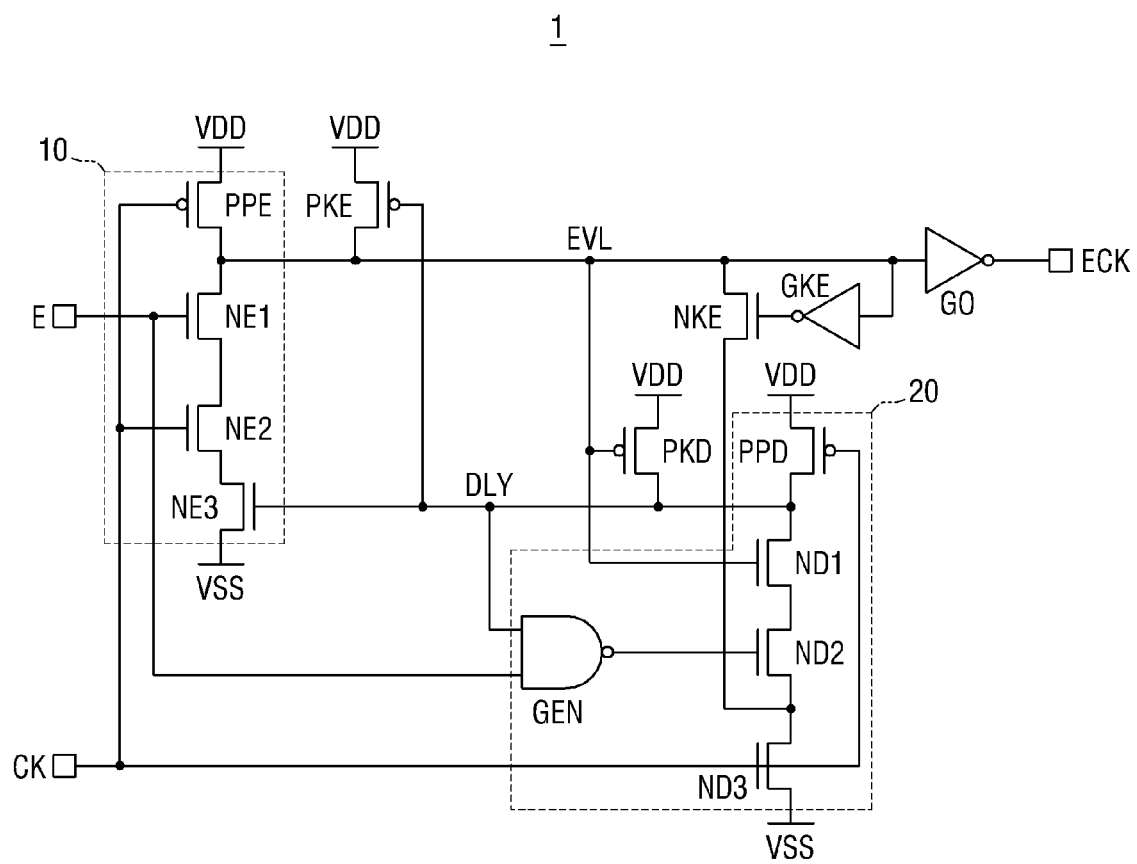
FIG. 1 is a circuit diagram illustrating a semiconductor device according to an embodiment of the inventive concept.

Advantages and features of the inventive concept and methods of accomplishing the same may be understood more readily by reference to the following detailed description of embodiments and the accompanying drawings. The inventive concept may, however, be embodied in many different forms and should not be construed as being limited to only the illustrated embodiments. Rather, these embodiments are provided so that this disclosure will be thorough and complete and will fully convey the concept of the inventive concept to those skilled in the art. Throughout the written description and drawings, like reference numbers and labels are used to denote like of similar elements.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one element, component, region, layer or section from another region, layer or section. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure (FIG. 1 is a circuit diagram illustrating a semiconductor device according to an embodiment of the inventive concept.

Referring to FIG. 1, the semiconductor device (or semiconductor circuit) 1 includes a first circuit 10, a second circuit 20, and keeper circuits PKE, PKD and (NKE+GKE).

The first circuit 10 may be used to apply an enable signal E having a first logic level and a clock signal CK having the same first logic level H to other elements of the semiconductor device 1. In this regard, the term "logic level", as in first logic level and second logic level, is used to denote a particular signal state for a multi-state logic signal. Most commonly, logic signals will exhibit one of two states arbitrarily denominated as 'low' or 'high'. Of course, the low and high states may be variously defined. Accordingly, the terms "low logic level" and "high logic level" (or alternately, "first logic level" and "second logic level") are used respectively to denote opposite, binary (low/high) signal states. In the embodiments described hereafter, it is assumed that first logic level is high ('H') and a second logic level is low ('L'), but this need not always be the case and other embodiments may reverse these definitions.

In addition to applying the enable signal E and the clock signal CK, the first circuit 10 may also be used to provide a first voltage (e.g., VDD) to a first node EVL in order to convert a voltage level of the first node EVL from the first logic level to the second logic level.

In the illustrated example of FIG. 1, the first circuit 10 includes a first P-type Metal Oxide Semiconductor (PMOS) transistor, PPE, as well as first, second and third N-type MOS (NMOS) transistors, NE1, NE2 and NE3. However, those skilled in the art will recognize that the first circuit 10 may be variously implemented using, for example, a different number, different type(s) and different configurations of PMOS and NMOS transistors.

Here, the first PMOS transistor PPE is gated by the externally provided clock signal CK to provide the first voltage VDD to the first node EVL. That is, the gate terminal of the first PMOS transistor PPE receives the clock signal CK, a first terminal of the first PMOS transistor PPE receives the first voltage VDD, and a second terminal of the first PMOS transistor PPE is connected to the first node EVL.

The first NMOS transistor NE1 is gated by the enable signal E, the second NMOS transistor is gated by the clock signal CK, and the third NMOS transistor is gated by a signal of a second node DLY. The first, second and third NMOS transistors are series connected (sequentially, first terminal to second terminal) between a second voltage VSS and the first voltage VDD, such that the first terminal of the first NMOS transistor NE1 is connected to second terminal of the second NMOS transistor NE2, and the second terminal of the first NMOS transistor NE1 is connected to the first node EVL.

In this certain embodiments of the inventive concept, the second voltage VSS may be ground voltage.

In the illustrated example of FIG. 1, the second circuit 20 includes a second PMOS transistor, PPD; fourth, fifth and sixth NMOS transistors, ND1, ND2 and ND3; and an logic operation circuit GEN (e.g., a NAND gate). Here again, those skilled in the art will recognize that the second circuit 20 may be variously implemented using, for example, a different number, different type(s) and different configurations of PMOS and NMOS transistors.

The second PMOS transistor PPD is gated by the clock signal CK and provides the first voltage VDD to the second node DLY. That is, the gate terminal of the second PMOS transistor PPD receives the clock signal CK, a first terminal thereof receives the first voltage VDD, and a second terminal thereof is connected to the second node DLY.

The fourth, fifth and sixth NMOS transistors, ND1, ND2 and ND3, are respectively gated by the voltage of the first node EVL, an output of the operation circuit GEN and the clock signal CK. In combination, the fourth, fifth and sixth NMOS transistors, ND1, ND2 and ND3 may be used to provide the second voltage VSS to the second node DLY.

That is, a gate terminal of the sixth NMOS transistor ND3 receives the clock signal CK, a first terminal thereof receives the second voltage VSS, and a second terminal thereof is connected to the second NMOS transistor ND2. A gate terminal of the fifth NMOS transistor ND2 receive the output of the operation circuit GEN, a first terminal thereof is connected to the sixth NMOS transistor ND3, and a second terminal thereof may be connected to the fourth NMOS transistor ND1. A gate terminal of the fourth NMOS transistor ND1 is connected to the first node EVL, a first terminal thereof may be connected to the fifth NMOS transistor ND2, and a second terminal thereof is connected to the second node DLY. Thus, the fourth, fifth and sixth NMOS transistors are series connected between the second node DLY and the second voltage VSS.

The operation circuit GEN is illustrated in FIG. 1 as including at least a NAND gate. However, those skilled in the art will recognize that may reasonable combination of logic gates might be used, so long as the operation circuit GEN effectively performs a NAND operation on the voltage of the second node DLY and the enable signal E. As described above, the output of the operation circuit GEN (e.g., the NANDed output) is provided to the gate terminal of the fifth NMOS transistor ND2.

A first keeper circuit PKE is used in FIG. 1 to 'keep' (i.e., maintain) the voltage level of the first node EVL at the first logic level H. Thus, a gate terminal of the first keeper circuit PKE is connected to the second node DLY, a first terminal thereof is connected to the first voltage VDD, and a second terminal thereof is connected to the first node EVL.

Figure 2:
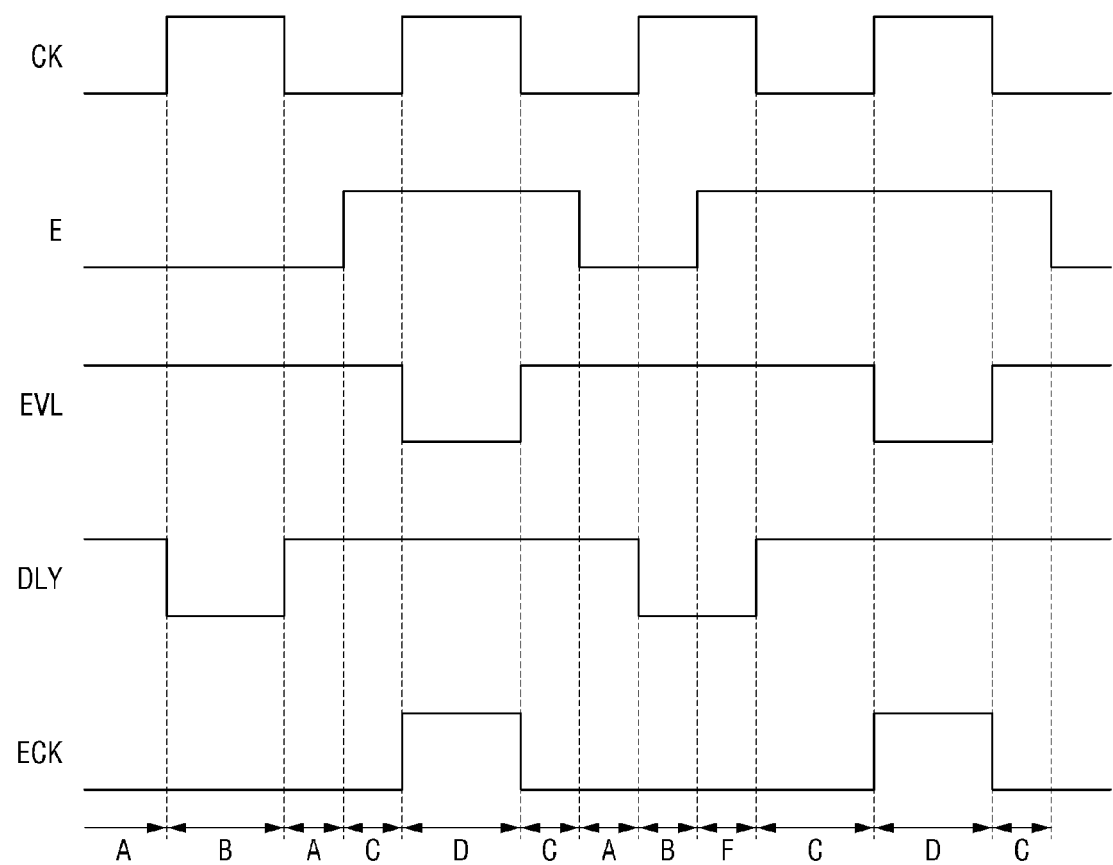
FIG. 2 is a timing diagram further illustrating the operation of the semiconductor device shown in FIG. 1.

A second keeper circuit PKD is used in FIG. 2 to keep the voltage of the second node DLY at the first logic level H. Thus, a gate terminal of the second keeper circuit PKD is connected to the first node EVL, a first terminal thereof is connected to the first voltage VDD, and a second terminal thereof is connected to the second node DLY.

The third keeper circuit, a combination of GKE and NKE, is used in FIG. 1 to keep the voltage of the first node EVL at a second logic level L. Here, the third keeper circuit GKE is an inverter GKE that inverts a voltage of the first node EVL, and a seventh NMOS transistor NKE gated by the output of the inverter GKE and connected between the first node EVL and the second terminal of the sixth NMOS transistor ND3.

Once again, those skilled in the art will recognize that any one of the foregoing first, second and third keeper circuits may be differently configured to obtain the respectively described results.

Finally, the semiconductor device 1 of FIG. 1 includes an inverter GO that inverts the voltage of the first node EVL in order to provide an output (or an enabled) clock ECK.

Hereinafter, operation of the semiconductor device 1 described in relation to FIG. 1 will be variously and further described with reference to FIGS. 2, 3, 4, 5, 6, and 7.

FIG. 2 is a timing diagram illustrating various signal levels for elements ad circuits of the semiconductor device 1 shown in FIG. 1. FIGS. 3, 4, 5, 6 and 7 are respective circuit diagrams variously annotated to further illustrate the operation of the semiconductor device 1 shown in FIGS. 1 and 2.

Figure 3:
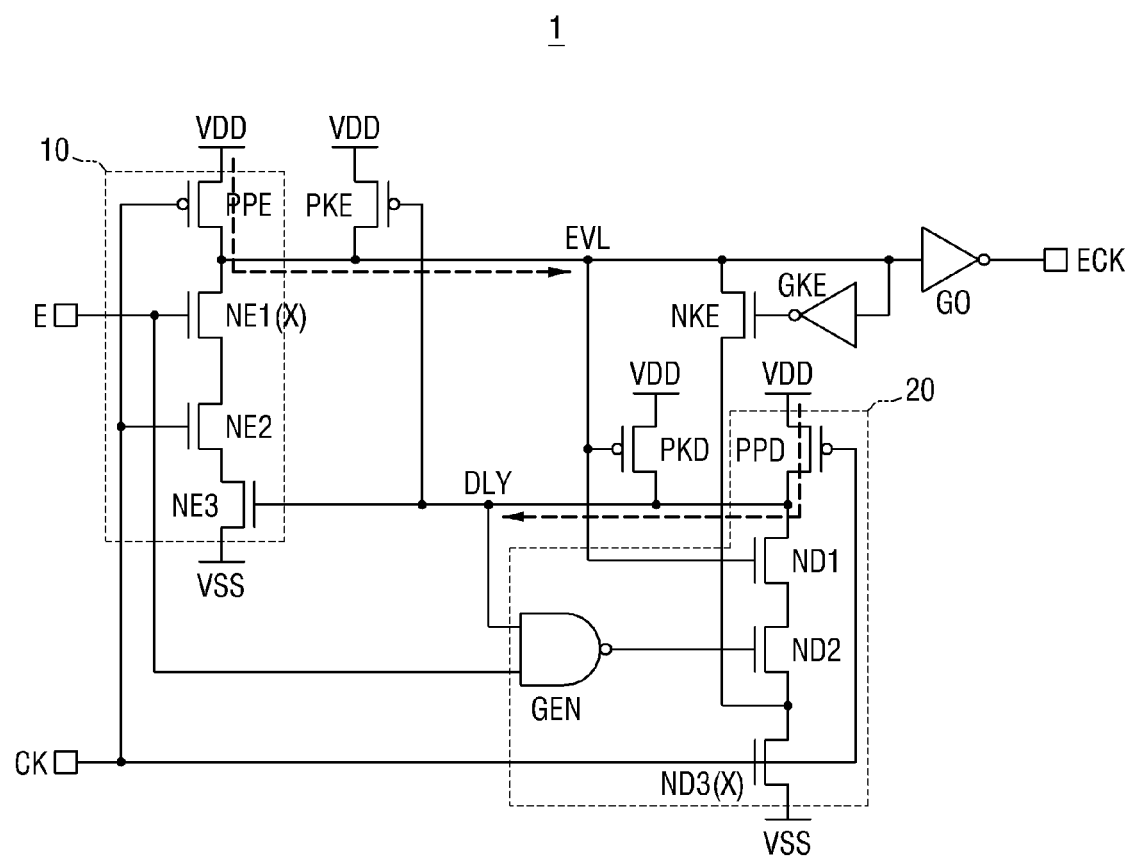
FIGS. 3, 4, 5, 6 and 7 are annotated circuit diagrams still further illustrating the operation of the semiconductor device shown in FIGS. 1 and 2.

Referring to FIGS. 2 and 3, when the clock signal CK has the second logic level L and the enable signal E has the second logic level L during period A, the first PMOS transistor PPE is turned ON to supply the first voltage VDD to the first node EVL. Here, the first NMOS transistor NE1 is turned OFF, so the first node EVL is not connected to the second voltage VSS. Therefore, the first node ELV is pre-charged to the first logic level H. In other words, the level of the voltage of the first node ELV is developed to the level of the first voltage VDD.

Meanwhile, the second PMOS transistor PPD is turned ON to provide the first voltage VDD to the second node DLY. The sixth NMOS transistor ND3 is turned OFF, so the second node DLY is not connected to the second voltage VSS. Therefore, the second node DLY is also pre-charged to the first logic level H. In other words, the level of the voltage of the second node DLY is developed to a level of the first voltage VDD.

Figure 4:
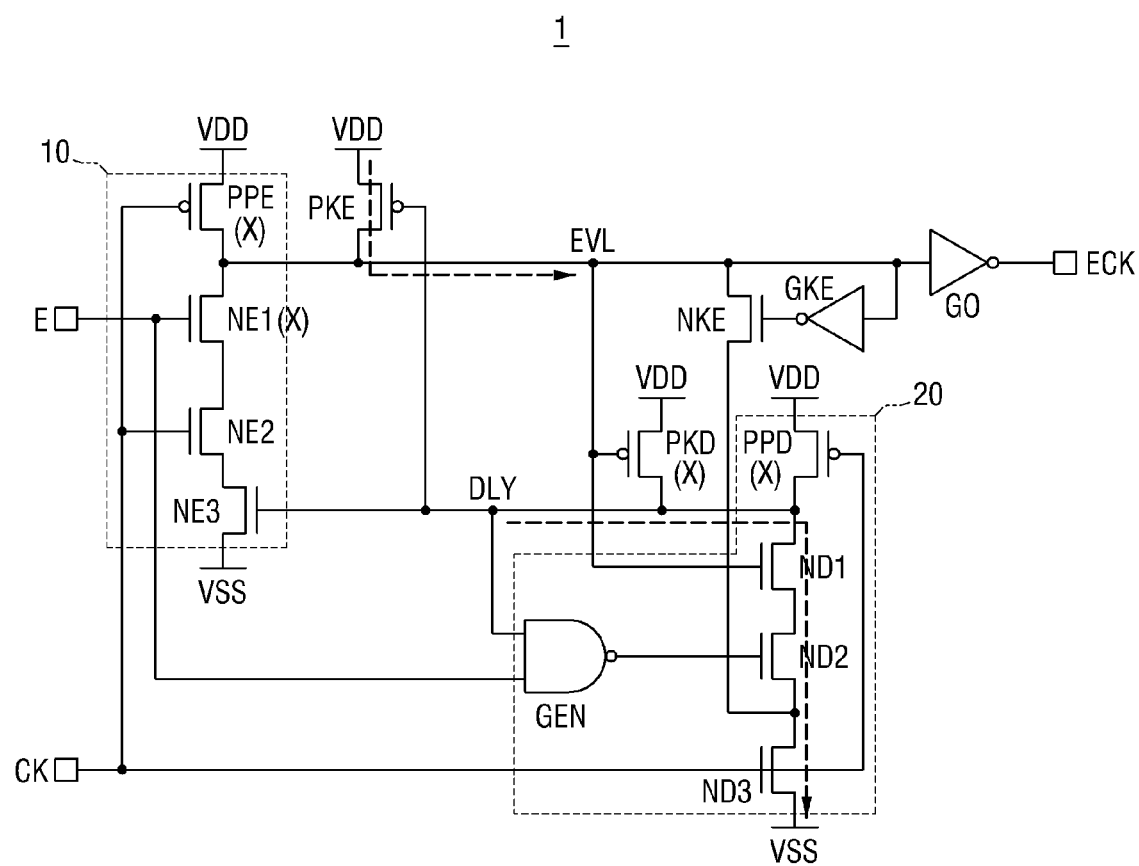

Referring to FIGS. 2 and 4, in response to the enable signal E being kept at the second logic level L during period B and the clock signal CK transitioning to the first logic level H, the first PMOS transistor PPE is turned OFF, so the first voltage VDD is no longer supplied to the first node EVL. Here, the first NMOS transistor NE1 is turned OFF, so the first node EVL is not connected to the second voltage VSS. The second PMOS transistor PPD is also turned OFF, so that the first voltage VDD is not supplied to the second node DLY.

Since the voltage of the first node EVL is kept at the first logic level H, the fourth NMOS transistor ND1 is turned ON, and since the clock signal CK has the first logic level H, the sixth NMOS transistor ND3 is also turned ON.

Under these conditions, the respective logic levels of the second node DLY and output of the operation circuit GEN will depend on the logic level of the enable signal E, as listed in Table 1.

TABLE 1

| DLY | E | Output |
|---|---|---|
| L | L | H |
| H | L | H |
| L | H | H |
| H | H | L |

Since the voltage level of the second node DLY is the first logic level H during period A, the output of the operation circuit GEN during period B will be the first logic level H. Accordingly, the fifth NMOS transistor ND2 is turned ON.

As described above, if the fourth, fifth and sixth transistors, ND1, ND2 and ND3, and all turned ON, the second voltage VSS is supplied to the second node DLY.

Accordingly, the voltage level of the second node DLY will transition to the second logic level L. That is to say, the second node DLY is discharged to the second logic level L, alternately phrased, the level of the voltage of the second node DLY is developed to the second voltage VSS.

As described above, if the voltage level of the second node DLY transitions to the second logic level L, the first keeper circuit PKE is turned ON, so that the first voltage VDD is supplied to the first node EVL, or in other words, the voltage level of the first node EVL is kept at the first logic level H.

Figure 5:
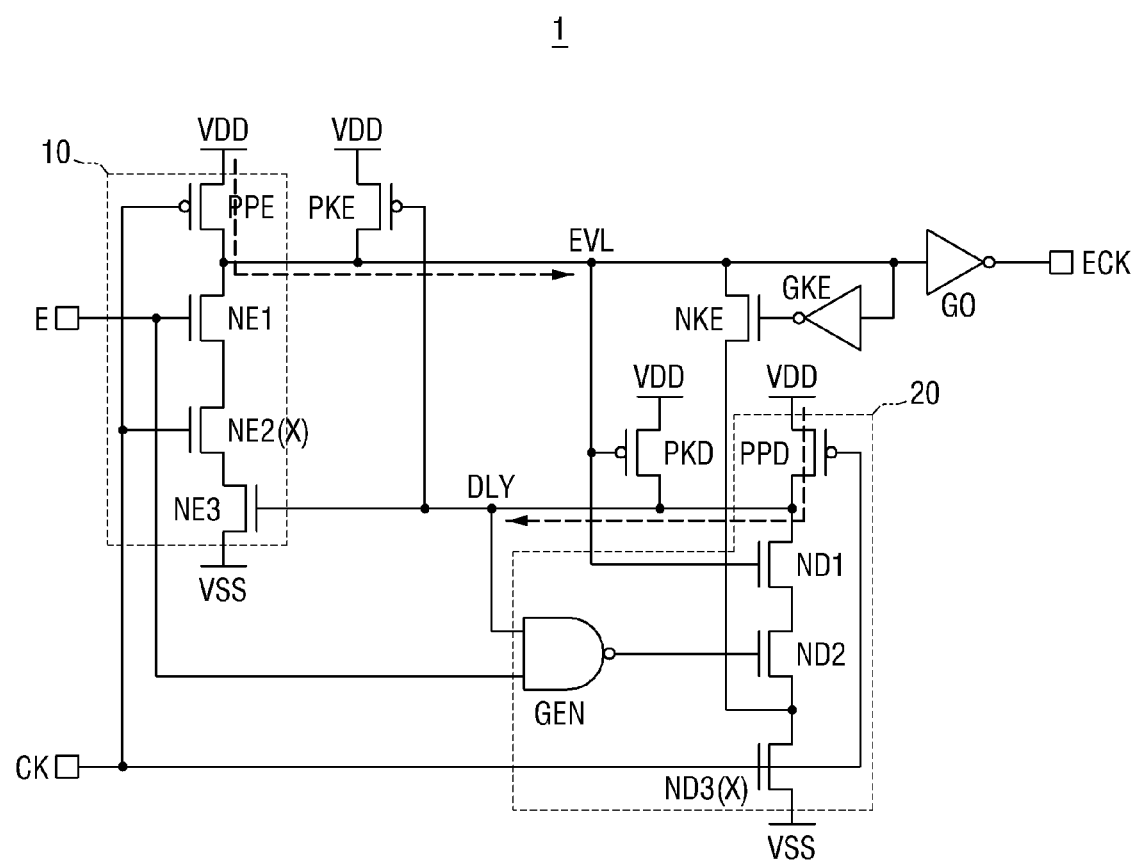

Referring to FIGS. 2 and 5, in response to the clock signal CK being kept at the second logic level L during period C and the enable signal E transitioning to the first logic level H, the first PMOS transistor PPE is turned ON, so that the first voltage VDD is supplied to the first node EVL. Here, the second NMOS transistor NE2 is turned OFF, so that the first node EVL is not connected to the second voltage VSS. Accordingly, the voltage level of the first node EVL is kept at the first logic level H.

Meanwhile, the second PMOS transistor PPD is turned ON to supply the first voltage VDD to the second node DLY, and the sixth NMOS transistor ND3 is turned OFF, so that the second node DLY is not connected to the second voltage VSS. Accordingly, the voltage level of the second node DLY is also kept at the first logic level H.

Figure 6:
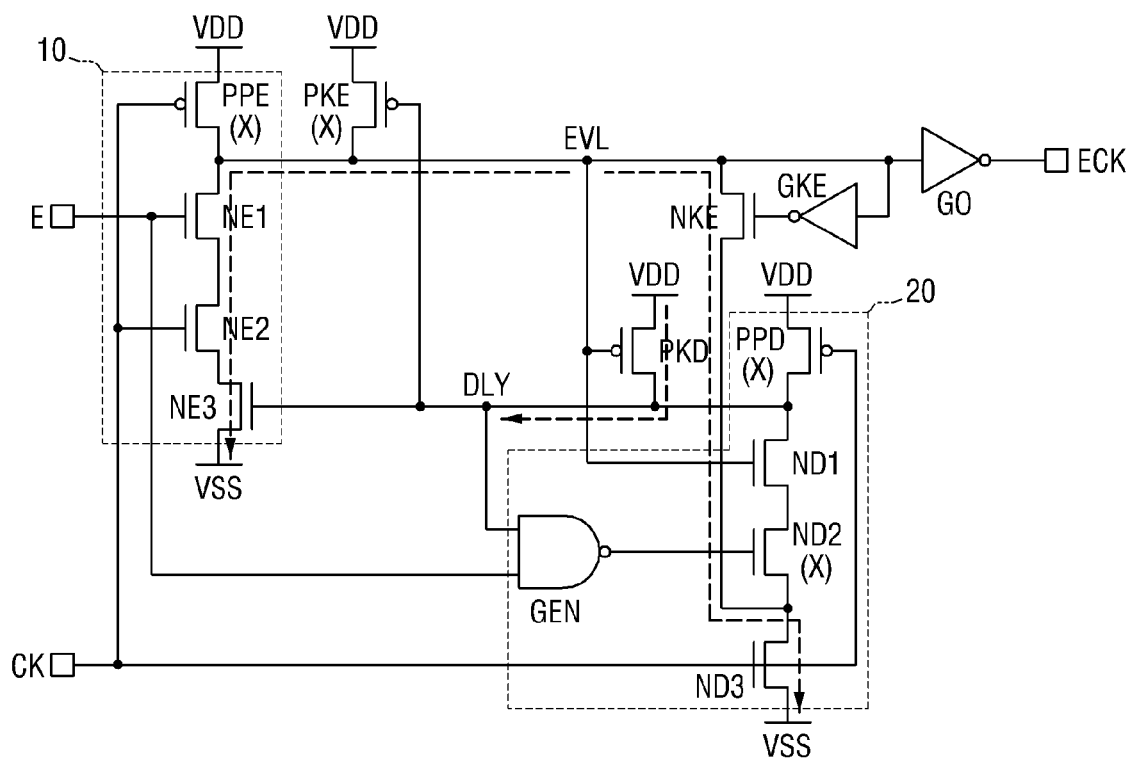

Referring to FIGS. 2 and 6, in response to the enable signal E having the first logic level H during period D and the clock signal CK transitioning to the first logic level H, the first PMOS transistor PPE is turned OFF, so that the first voltage VDD is not supplied to the first node EVL.

Since all of the first, second and third NMOS transistors NE1 to NE3 are turned ON, the first node EVL is connected to the second voltage VSS. Accordingly, the voltage level of the first node EVL is developed to the second voltage VSS, or otherwise stated, the first node EVL is discharged to the second logic level L.

In addition, since the third keeper circuit (seventh NMOS transistor) NKE and the sixth NMOS transistor ND3 are turned ON, the first node EVL is connected to the second voltage VSS via the sixth NMOS transistor ND3. Accordingly, the voltage level of the first node EVL is developed to the second voltage VSS, or otherwise stated, the first node EVL is discharged to the second logic level L.

As described above, if the voltage level of the first node EVL transitions to the second logic level L, the enabled clock signal ECK will transition to the first logic level H through the inverter G0.

However, if the second PMOS transistor PPD is turned OFF, the first voltage VDD will not be supplied to the second node DLY any longer. As described above, since the voltage level of the first node EVL transitions to the second logic level L, the second keeper circuit PKD is turned ON. Accordingly, the first voltage VDD is supplied to the second node DLY via the second keeper circuit PKD.

Referring back to Table 1, the output of the operation circuit GEN transitions to the second logic level L when the enable signal and the voltage level of the second node BLY are both at the first logic level H. Accordingly, the fifth NMOS transistor ND2 is turned OFF, so that the second node DLY is not connected to the second voltage VSS. Therefore, the voltage level of the second node DLY is kept at the first logic level H.

Figure 7:
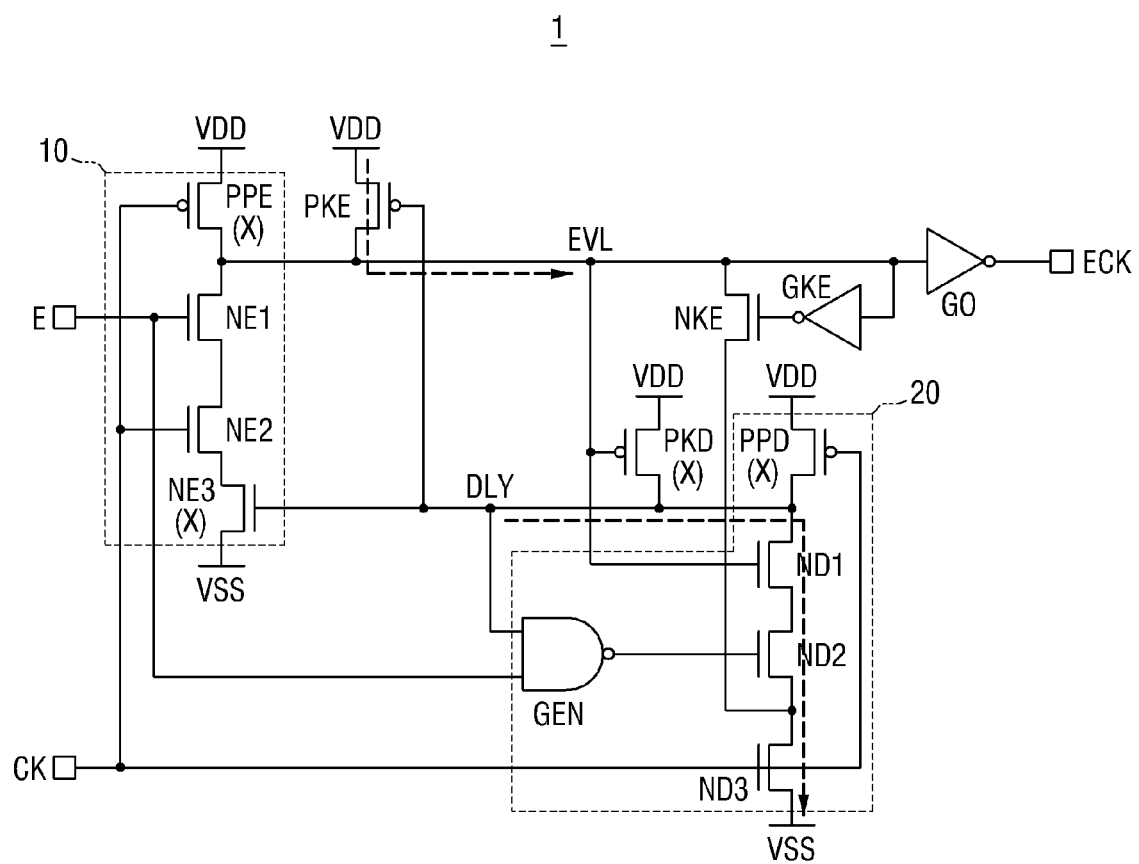

Referring to FIGS. 2 and 7, in response to the clock signal CK being kept at the first logic level H during a period F and the enable signal E transitioning to the first logic level H, the transistor first PMOS transistor PPE is turned OFF, so that the first voltage VDD is not supplied to the first node EVL.

Since the voltage level of the second node DLY is the second logic level L during the period B (adjacent to the period F) the third NMOS transistor NE3 is turned OFF. Therefore, the first node EVL is not connected to the second voltage VSS. In addition, since the voltage level of the second node DLY is the second logic level L during the period B, the first keeper circuit PKE is turned ON. Accordingly, the first voltage VDD is supplied to the first node EVL via the first keeper circuit PKE, and accordingly, the voltage level of the first node EVL is kept at the first logic level H.

Under these conditions, the second PMOS transistor PPD is turned OFF, so that the first voltage VDD is not supplied to the second node DLY. In addition, since the voltage level of the first node EVL is kept at the first logic level H, the second keeper circuit PKD is not turned ON.

With the fourth and sixth NMOS transistors ND1 and ND3 turned ON, the output of the operation circuit GEN is kept at the first logic level H, and accordingly, the fifth NMOS transistor ND2 is turned ON. (See again. Table 1).

Since the fourth, fifth and sixth transistors, ND1, ND2 and ND3, are all turned ON, the second node DLY transitions to the second voltage VSS. Accordingly, the voltage level of the second node DLY is developed to the second voltage VSS, or in other words, the voltage level of the second node DLY is kept at the second logic level L.

Based on the above-described operation, in certain embodiments of the inventive concept, the semiconductor device 1 of FIG. 1 may be used as a clock gating device with the operational timing shown in FIG. 2. In such embodiments, the operation circuit GEN and fifth NMOS transistor ND2 may serve to keep the voltage level of the second node DLY at the first logic level H—even if the first node EVL discharges to the second voltage VSS. Accordingly, the reliability of the operation circuit GEN may be improved. In addition, since the operation circuit GEN and the fifth NMOS transistor ND2 occupy a relatively small amount of chip area, an electronic device incorporating the clock gating device may be reduced in size.

Figure 8:
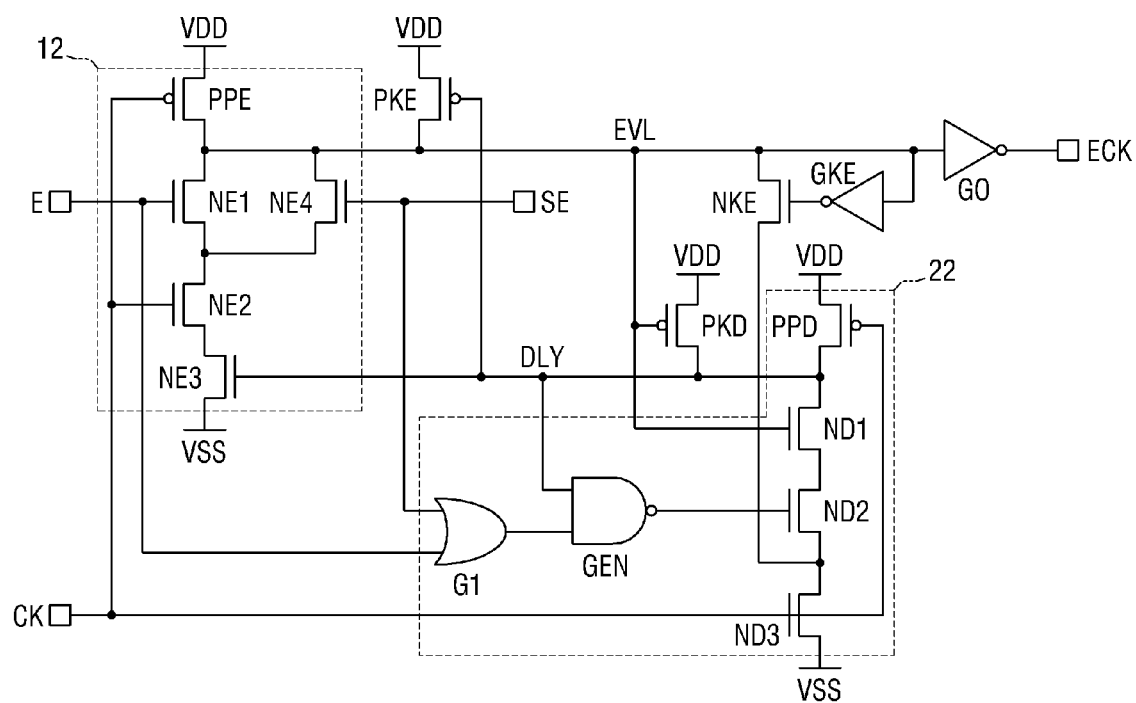
FIG. 8 is a circuit diagram of a semiconductor device according to another embodiment of the inventive concept.

FIG. 8 is a circuit diagram illustrating a semiconductor device 2 according to another embodiment of the inventive concept. The following description focuses primarily on the differences between the embodiments illustrated in FIGS. 8, 9 and 10 and the embodiment previously described with respect to FIG. 1.

Referring to FIG. 8, the semiconductor device 2 includes a first circuit 12 and a second circuit 22. However, the first circuit 12 of FIG. 8 differs from the first circuit 10 of FIG. 1 in that an additional NMOS transistor NE4 is added, and the second circuit 22 of FIG. 8 differs from the second circuit 20 of FIG. 1 in that a second logic gate (e.g., an OR gate G1) is added.

The added NMOS transistor NE4 is gated by a scan enable signal SE and may be used to transition the level of the voltage of the second node DLY to the second logic level L. The added OR gate G1 may be used to perform an OR operation on the enable signal E and the scan enable signal SE, with the output of the OR gate being provided to the operation circuit GEN along with the voltage of the second node DLY.

Thus, in FIG. 8, a first, enable-circuit, NMOS transistor (NE1) is gated by the enable signal E, and a fourth, enable-circuit, NMOS transistor (NE4) is gated by the scan enable signal SE. These two transistors NE1 and NE4 are connected in parallel to one another with respect to a first node EVL, where the enable signal E and scan enable signal SE are also applied to the OR gate G1 and subjected to an OR operation result, the result of which is provided to the operation circuit GEN. Accordingly, the semiconductor device 2 of FIG. 8 provides an enabled clock signal ECK derived from an input clock signal CK only while at least one of the enable signal E and scan enable signal SE has the first logic level H.

The operation and interoperation of the elements and circuits of semiconductor device 2 are respectively and substantially the same as the analogous elements and circuits described in relation to the embodiment shown in FIG. 1. In this regard, the numbering and identification of the respective transistor elements shown in FIGS. 1 and 8 is arbitrary. That is, PMOS and NMOS transistors may be designated across the entire circuit diagram as first through Nth, or separately as NE1 through NEN and ND1 through NDN in relation to the first and second circuits (10/20 and 12/22), where 'N' is a natural number greater than one.

Figure 9:
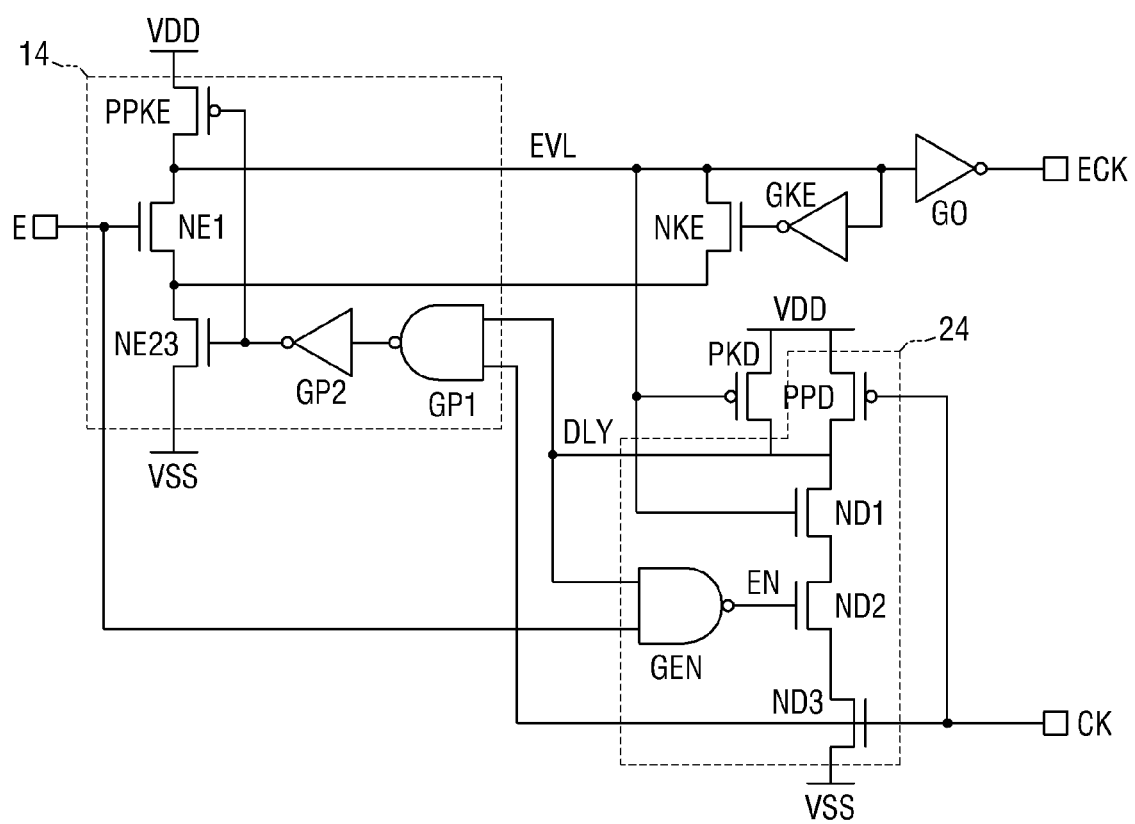
FIG. 9 is a circuit diagram of a semiconductor device according to still another embodiment of the inventive concept.

FIG. 9 is a circuit diagram illustrating a semiconductor device 3 according to still another embodiment of the inventive concept.

Referring to FIG. 9, the semiconductor device 3 includes a first circuit 14 and a second circuit 24. Compared to the first circuit 10 of FIG. 1 that included first, second and third NMOS transistors NE1, NE2 and NE3, the first circuit 14 of FIG. 9 includes only a single enable-circuit NMOS transistor NE23.

In order for the semiconductor device 3 to perform the same operation as the semiconductor device 1, the first circuit 14 of the semiconductor device 2 further includes an inverter GP2 and a NAND gate GP1.

Here, the NAND gate GP1 performs a NAND operation on a voltage of the second node DLY and the input clock signal CK. The NANDed result is applied to an input of the inverter GP2. Thus, the inverter GP2 inverts the output of the NAND gate GP1 and uses the resulting signal to gate both PMOS transistor PPKE and transistor NE23.

Hence, the transistor NE23 is gated by the output of the inverter GP2 to provide the second voltage VSS to a first node EVL.

In response, the transistor NE23 is turned ON and the PMOS transistor PPKE is turned OFF during a period in which the first node EVL is to be discharged to the second voltage VSS (analogous to period D of FIG. 2). Accordingly, the semiconductor device 3 shown in FIG. 9 may operate in the same manner as the semiconductor device 1 shown in FIG. 1.

Figure 10:
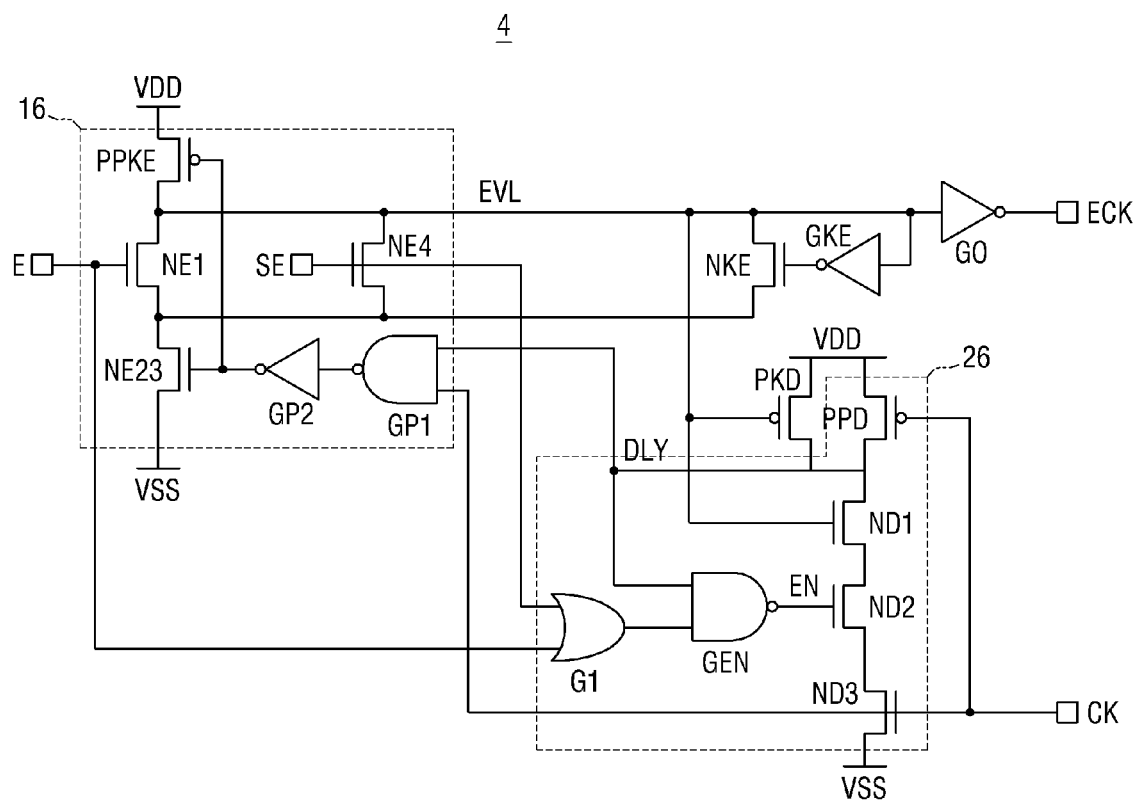
FIG. 10 is a circuit diagram of a semiconductor device according to still another embodiment of the inventive concept.

FIG. 10 is a circuit diagram illustrating a semiconductor device 4 according to still another embodiment of the inventive concept.

Referring to FIG. 10, the semiconductor device 3 includes a first circuit 16 and a second circuit 26. Compared to the previous embodiment, the first circuit 16 may further include a transistor NE4 and the second circuit 26 may further include an OR gate G1.

Here, the transistor NE4 is gated by the scan enable signal SE to cause the voltage of the second node DLY to transition to the second logic level L. The OR gate G1 again performs an OR operation on the enable signal E and the scan enable signal SE in order to provide a result of the OR operation to the operation circuit GEN.

As shown in FIG. 10, a transistor NE1 is gated by the enable signal E and a transistor NE4 gated by the scan enable signal SE are connected in parallel to each other with respect to a first node EVL. The enable signal E and the scan enable signal SE are OR-operated and an OR operation result is supplied to the operation circuit GEN.

Accordingly, the semiconductor device 4 of FIG. 10 may output the enabled clock signal ECK derived from an input clock signal CK so long as at least one of the enable signal E and the scan enable signal SE has the first logic level H.

Figure 11:
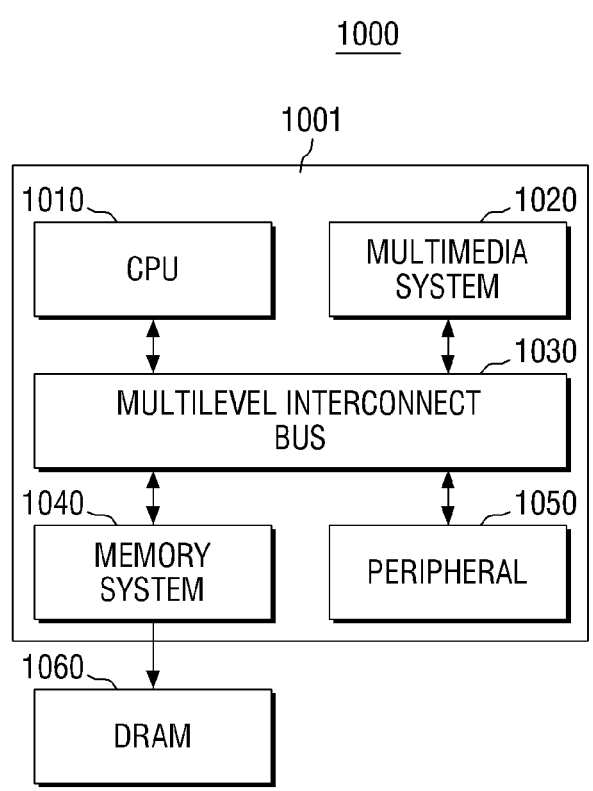
FIG. 11 is a block diagram of a system on chip (SoC) system including semiconductor devices according to embodiments of the inventive concept.

FIG. 11 is a block diagram illustrating a system on chip (SoC) including one or more semiconductor devices according to various embodiments of the inventive concept.

Referring to FIG. 11, the SoC system 1000 includes an application processor 1001 and a DRAM 1060. The application processor 1001 may include a central processing unit (CPU) 1010, a multimedia system 1020, a bus 1030, a memory system 1040, and a peripheral circuit 1050.

The CPU 1010 may execute computations required to drive the SoC system 1000. In exemplary embodiments of the inventive concept, the CPU 1010 may be configured by multi-core environments including a plurality of cores.

The multimedia system 1020 may be used when the SoC system 1000 performs various multimedia functions. The multimedia system 1020 may include a 3D engine module, a video codec, a display system, a camera system, and a post-processor.

The bus 1030 may be used when the CPU 1010, the multimedia system 1020, the memory system 1040, and the peripheral circuit 1050 perform data communication with each other. In exemplary embodiments of the inventive concept, the bus 1030 may have a multi-layer structure. In detail, examples of the bus 1030 may include a multi-layer advanced high-performance bus (AHB) or a multi-layer advanced eXtensible interface (AXI), but aspects of the inventive concept are not limited thereto.

The memory system 1040 may provide an environment required for high-speed operation of the application processor 1001 connected to an external memory (for example, DRAM 1060). In embodiments of the inventive concept, the memory system 1040 may include a separate controller (e.g., a DRAM controller) that controls the external memory (e.g., DRAM 1060).

The peripheral circuit 1050 may provide environments required for the SoC system 1000 to be smoothly connected to an external device (e.g., a main board). Accordingly, the peripheral circuit 1050 may include various interfaces to be compatible with the external device connected to the SoC system 1000.

The DRAM 1060 may function as a working memory required for the application processor 1001 to operate. In embodiments of the inventive concept, as shown, the DRAM 1060 may be positioned outside the application processor 1001. That is, the DRAM 1060 may be packaged with the application processor 1001 in the form of a package on package (PoP).

At least one of the components of the SoC system 1000 may employ a semiconductor device, such as semiconductor devices 1, 2, 3 and 4 described above, according to an embodiment of the inventive concept.

Figure 12:
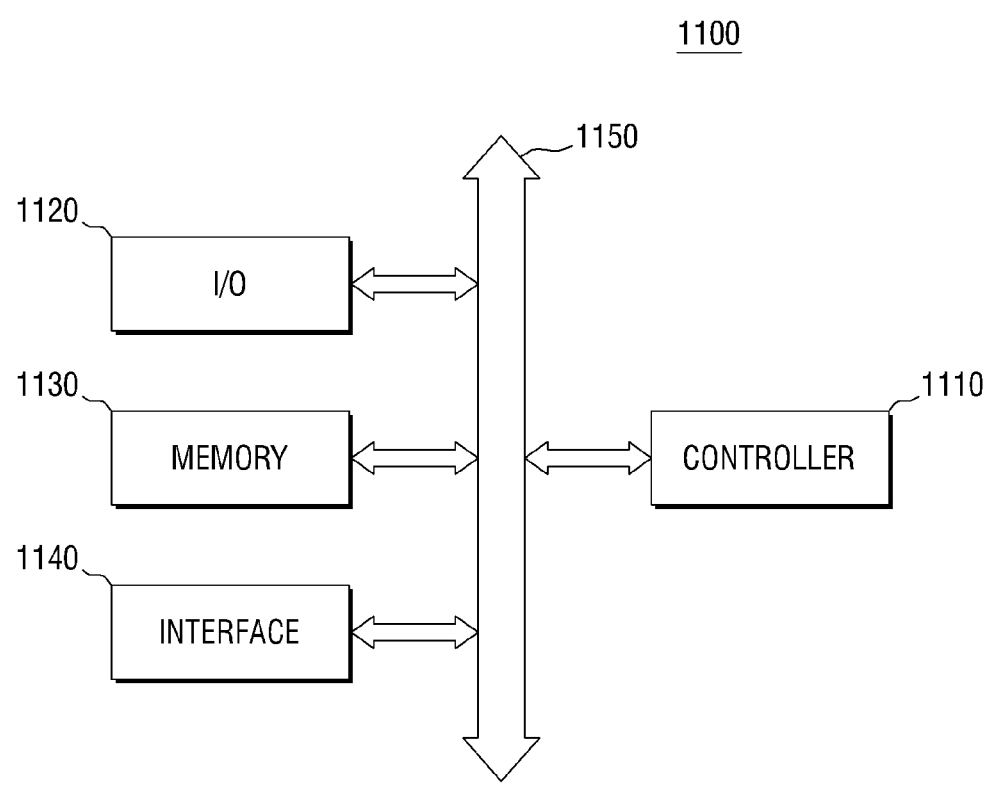
FIG. 12 is a block diagram of an electronic system including semiconductor devices according to embodiments of the inventive concept.

FIG. 12 is a block diagram of an electronic system including semiconductor devices according to embodiments of the inventive concept.

Referring to FIG. 12, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as a working memory for improving the operation of the controller 1110. The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

At least one of the components of the electronic system 1100 may employ one of the semiconductor devices 1 to 4 according to exemplary embodiments of the inventive concept.

Figure 13:
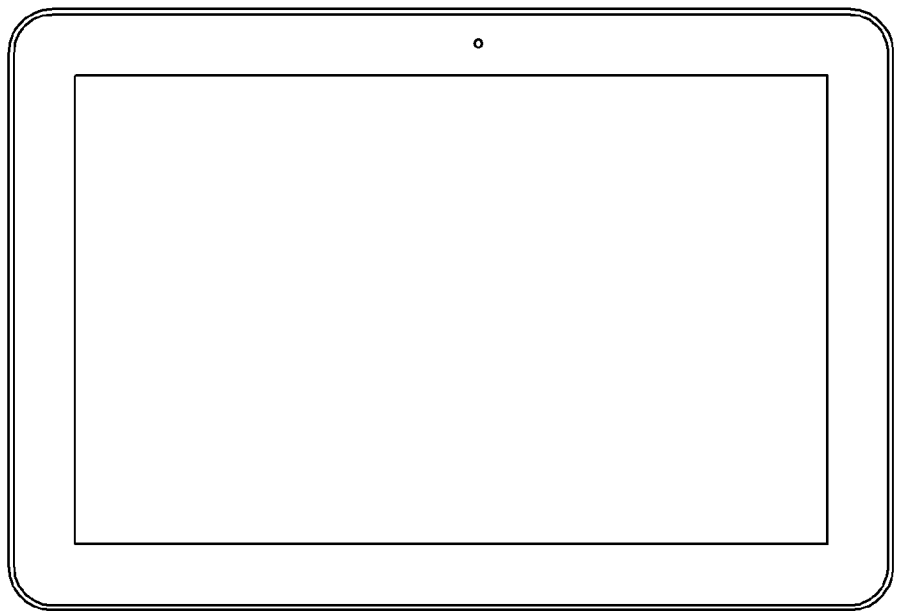
FIGS. 13, 14 and 15 illustrate semiconductor systems to which semiconductor devices according to embodiments of the inventive concept can be applied.
Figure 14:
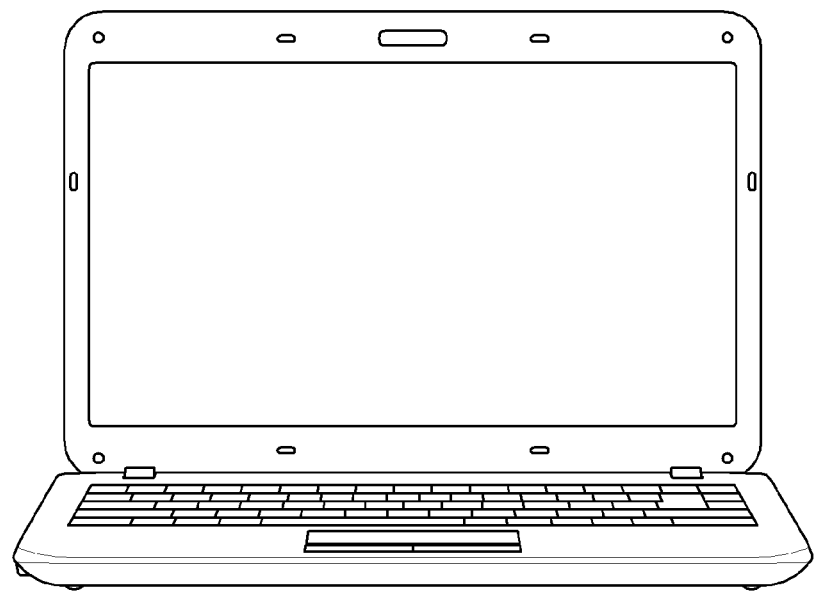
Figure 15:
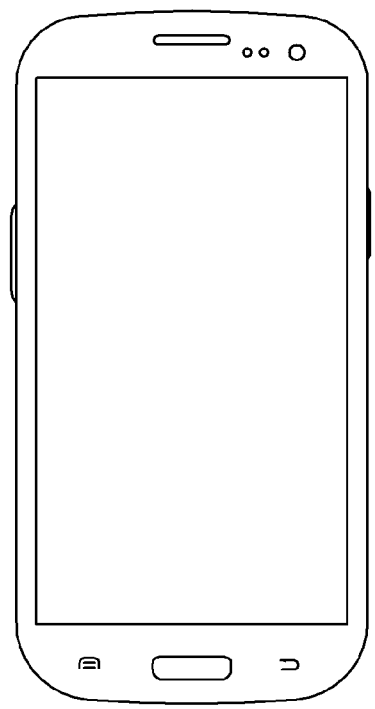

FIGS. 13, 14 and 15 illustrate exemplary electronic systems to which semiconductor devices according to embodiments of the inventive concept may be applied.

FIG. 13 illustrates an example in which a semiconductor device according to an embodiment of the inventive concept is applied to a tablet PC (1200). FIG. 14 illustrates an example in which a semiconductor device according to an embodiment of the inventive concept is applied to a notebook computer (1300), and FIG. 15 illustrates an example in which a semiconductor device according to an embodiment of the inventive concept is applied to a smart phone (1400). In the above-described embodiments, only the tablet PC 1200, the notebook computer 1300 and the smart phone 1400 have been exemplified as the semiconductor devices 1 to 4 according to the embodiments of the inventive concept, but aspects of the inventive concept are not limited thereto. In embodiments of the inventive concept, the semiconductor system may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the inventive concept has been particularly shown and described with reference to exemplary embodiments thereof, it will be understood by those of ordinary skill in the art that various changes in form and details may be made therein without departing from the scope of the inventive concept as defined by the following claims.

What is claimed is:

1. A semiconductor device comprising:
   a first circuit configured to receive an enable signal having a first logic level and a clock signal having the first logic level, and to provide a first voltage to a first node to change a voltage level of the first node from the first logic level to a second logic level different from the first logic level; and
   a second circuit configured to receive the enable signal having the second logic level and the clock signal having the first logic level, and to provide a second voltage to a second node different from the first node to change a voltage level of the second node from the first logic level to the second logic level,
   wherein the second circuit comprises:
   an operation circuit performing a NAND operation on the enable signal and the voltage level of the second node to generate a NAND result; and
   a switch turned ON in response to the NAND result to provide the second voltage to the second node.

2. The semiconductor device of claim 1, wherein one of the first voltage and the second voltage is a ground voltage.

3. The semiconductor device of claim 1, wherein the first logic level is a logical high level and the second logic level is a logical low level.

4. The semiconductor device of claim 1, wherein the second circuit is configured to receive the enable signal having the second logic level and the clock signal having the second logic level and to provide a third voltage to the second node to change a voltage level of the second node from the second logic level to the first logic level; and
   the second circuit is configured to receive the enable signal having the first logic level and the clock signal having the second logic level and keeps the voltage of the second node at the first logic level.

5. The semiconductor device of claim 1, wherein the switch is an N-type Metal Oxide Semiconductor (NMOS) transistor gated by the NAND result to provide the second voltage to the second node.

6. The semiconductor device of claim 1, further comprising:
   a first keeper circuit gated the voltage of the second node to keep the voltage of the first node at the first logic level; and
   a second keeper circuit gated by the voltage of the first node to keep the voltage of the second node at the first logic level.

7. The semiconductor device of claim 6, further comprising:
   a third keeper circuit gated by the voltage of the first node to keep the voltage of the first node at the second logic level.

8. The semiconductor device of claim 7, wherein the third keeper circuit comprises:
   an inverter that inverts the voltage level of the first node to generate an inverted output; and
   a transistor gated by the inverted output to provide the first voltage to the first node.

9. The semiconductor device of claim 1, wherein the first circuit comprises:
   a first transistor gated by the clock signal to cause the voltage of the first node to transition to the first logic level;
   a second transistor gated by the enable signal to cause the voltage of the first node to transition to the second logic level;
   a third transistor gated by the clock signal to cause the voltage level of the first node to transition to the second logic level; and
   a fourth transistor gated to the voltage of the second node to cause the voltage of the first node to transition to the second logic level.

10. A semiconductor device comprising:
    a first circuit configured to receive an enable signal having a first logic level and a clock signal having the first logic level, and to provide a first voltage to a first node to transition a voltage level of the first node from the first logic level to a second logic level different from the first logic level; and
    a second circuit configured to receive the enable signal having the second logic level and the clock signal having the first logic level, and to provide a second voltage to a second node different from the first node to transition a voltage level of the second node from the first logic level to the second logic level,
    wherein the second circuit includes an operation circuit logically combining the enable signal and a voltage level of the second node to control a switch, such that the second voltage is connected to the second node when the switch is turned ON.

11. The semiconductor device of claim 10, wherein the switch is turned ON when the voltage of the second node is the second logic level, and is turned OFF when the voltage level of the second node is the first logic level.

12. The semiconductor device of claim 10, wherein the operation circuit is a NAND logic gate that performs a NAND operation on the enable signal and the voltage of the second node to provide a NAND result to a gate of the switch.

13. The semiconductor device of claim 12, wherein the switch comprises an NMOS transistor.

14. The semiconductor device of claim 10, wherein the first logic level is a logical high level and the second logic level is a logical low level.

15. The semiconductor device of claim 10, further comprising:
a first keeper circuit gated by the voltage of the first node to keep the voltage of the first node at the second logic level.

16. The semiconductor device of claim 14, further comprising:
a second keeper circuit gated by the voltage of the second node to keep the voltage of the first node at the first logic level; and
a third keeper circuit gated by the voltage of the first node to keep the voltage level of the second node at the first logic level.

17. A semiconductor device comprising:
a first node, and a second node;
a first transistor gated by a clock signal to evaluate a voltage at the first node;
a second transistor gated by an enable signal to further evaluate the voltage of the first node;
a third transistor gated by a voltage at the second node to still further evaluate the voltage of the first node;
a fourth transistor gated by the clock signal to evaluate a voltage at the second node;
a fifth transistor gated by the voltage of the first node to further evaluate the voltage of the second node;
an operation circuit that performs a NAND operation on the enable signal and the voltage of the second node to provide a NAND result; and
a sixth transistor gated by the NAND result to still further evaluate the voltage of the second node.

18. The semiconductor device of claim 17, wherein the first transistor is turned ON when the clock signal has a first logic level to evaluate the voltage level of the first node from the first logic level to a second logic level different from the first logic level; and
the semiconductor device further comprises:
another transistor connected between the second transistor and the third transistor and turned ON when the clock signal has the second logic level to evaluate the voltage level of the first node from the second logic level to the first logic level.

19. The semiconductor device of claim 17, wherein the sixth transistor is turned OFF when the enable signal has a first logic level and the voltage of the second node is the first logic level, such that a voltage is kept at the second node.

* * * * *